US011038417B2

(12) United States Patent
Colles et al.

(10) Patent No.: US 11,038,417 B2
(45) Date of Patent: Jun. 15, 2021

(54) SERIES-PARALLEL CHARGE PUMP WITH NMOS DEVICES

(71) Applicant: Silanna Asia Pte Ltd, Singapore (SG)

(72) Inventors: Joseph H. Colles, Bonsall, CA (US); Steven E. Rosenbaum, San Diego, CA (US); Stuart B. Molin, Carlsbad, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 16/990,277

(22) Filed: Aug. 11, 2020

(65) Prior Publication Data

US 2021/0036608 A1    Feb. 4, 2021

Related U.S. Application Data

(63) Continuation of application No. 16/529,018, filed on Aug. 1, 2019, now Pat. No. 10,763,746.

(51) Int. Cl.
*H02M 3/07* (2006.01)
*H03K 17/687* (2006.01)
*H02M 1/088* (2006.01)
*H02M 1/00* (2006.01)

(52) U.S. Cl.
CPC ............ *H02M 3/07* (2013.01); *H02M 1/088* (2013.01); *H03K 17/6872* (2013.01); *H02M 2001/009* (2013.01)

(58) Field of Classification Search
None
See application file for complete search history.

(56) References Cited

U.S. PATENT DOCUMENTS

| 3,824,447 | A  | 7/1974  | Kuwabara     |
|-----------|----|---------|--------------|
| 5,801,577 | A  | 9/1998  | Tailliet     |
| 5,856,918 | A  | 1/1999  | Soneda et al.|
| 6,642,775 | B2 | 11/2003 | Imamiya      |
| 7,279,957 | B2 | 10/2007 | Yen          |
| 7,369,419 | B2 | 5/2008  | Erbito       |
| 7,808,302 | B2 | 10/2010 | Xu et al.    |
| 8,358,520 | B2 | 1/2013  | Shvartsman   |
| 10,270,368| B2 | 4/2019  | Sampayan     |
| 2011/0169474 | A1 | 7/2011 | Cuk        |
| 2016/0322895 | A1 | 11/2016 | Less et al. |

OTHER PUBLICATIONS

Office Action dated Jan. 28, 2020 for U.S. Appl. No. 16/529,018.
Perez_Nicoli, Pablo et al., "A Series-Parallel Switched Capacitor Step-Up DC-DC Converter and its Gate-Control Circuits for Over the Supply Rail Switches," Wireless Power Transfer Conference (WPTC) 2015 IEEE, pp. 1-4, May 2015.

*Primary Examiner* — Jeffery S Zweizig
(74) *Attorney, Agent, or Firm* — MLO, a professional corp.

(57) ABSTRACT

A charge pump having only NMOS devices charges a plurality of capacitors to a parallel charged voltage level by electrically connecting the capacitors in parallel between an input voltage node and a ground by activating a plurality of first NMOS transistor switches and a plurality of second NMOS transistor switches and deactivating a plurality of third NMOS transistor switches. The charge pump then generates a series capacitor output voltage level at a capacitor series output node by electrically connecting and discharging the capacitors in series between the input voltage node and the capacitor series output node by activating the third NMOS transistor switches and deactivating the first NMOS transistor switches and the second NMOS transistor switches.

20 Claims, 3 Drawing Sheets

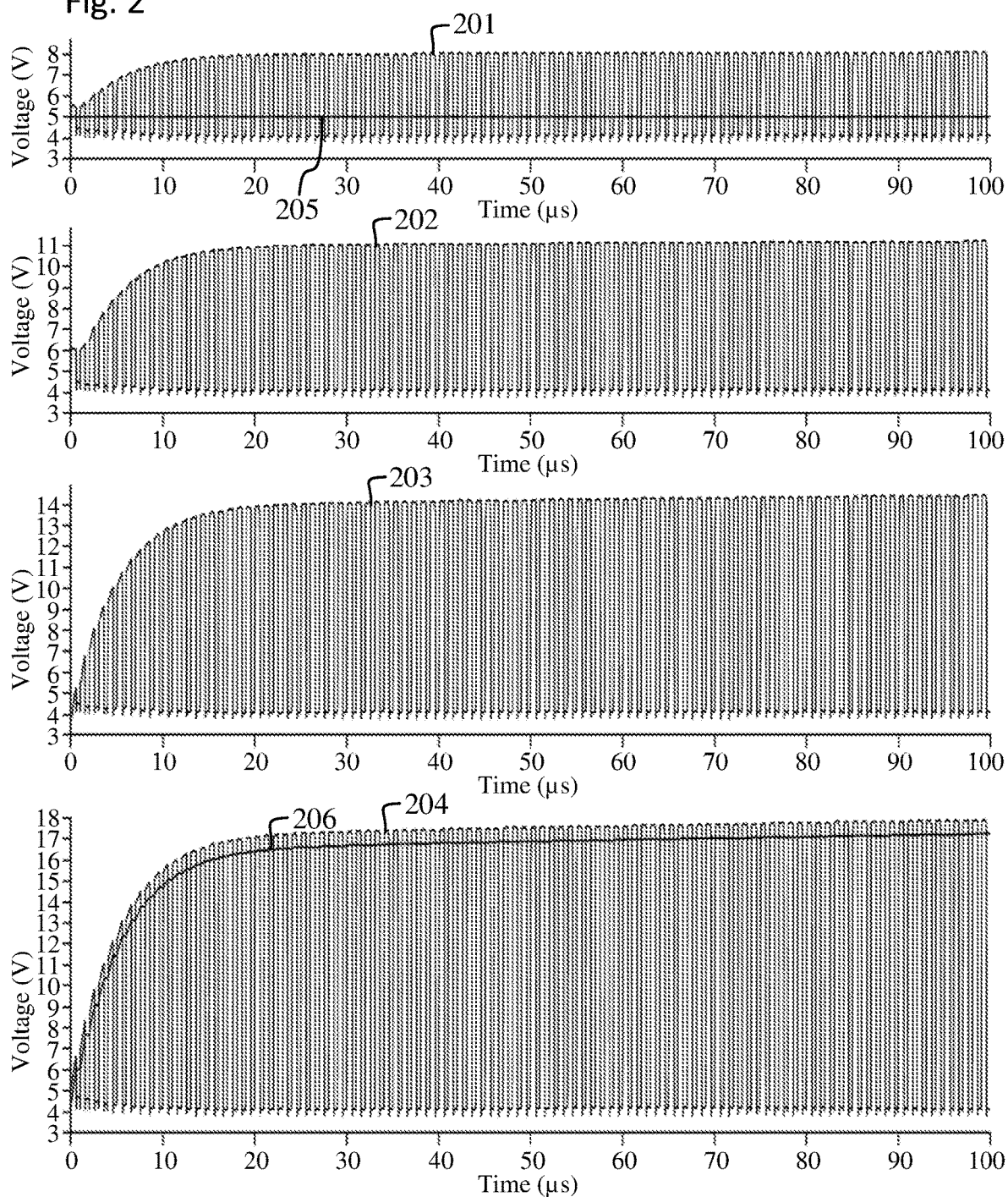

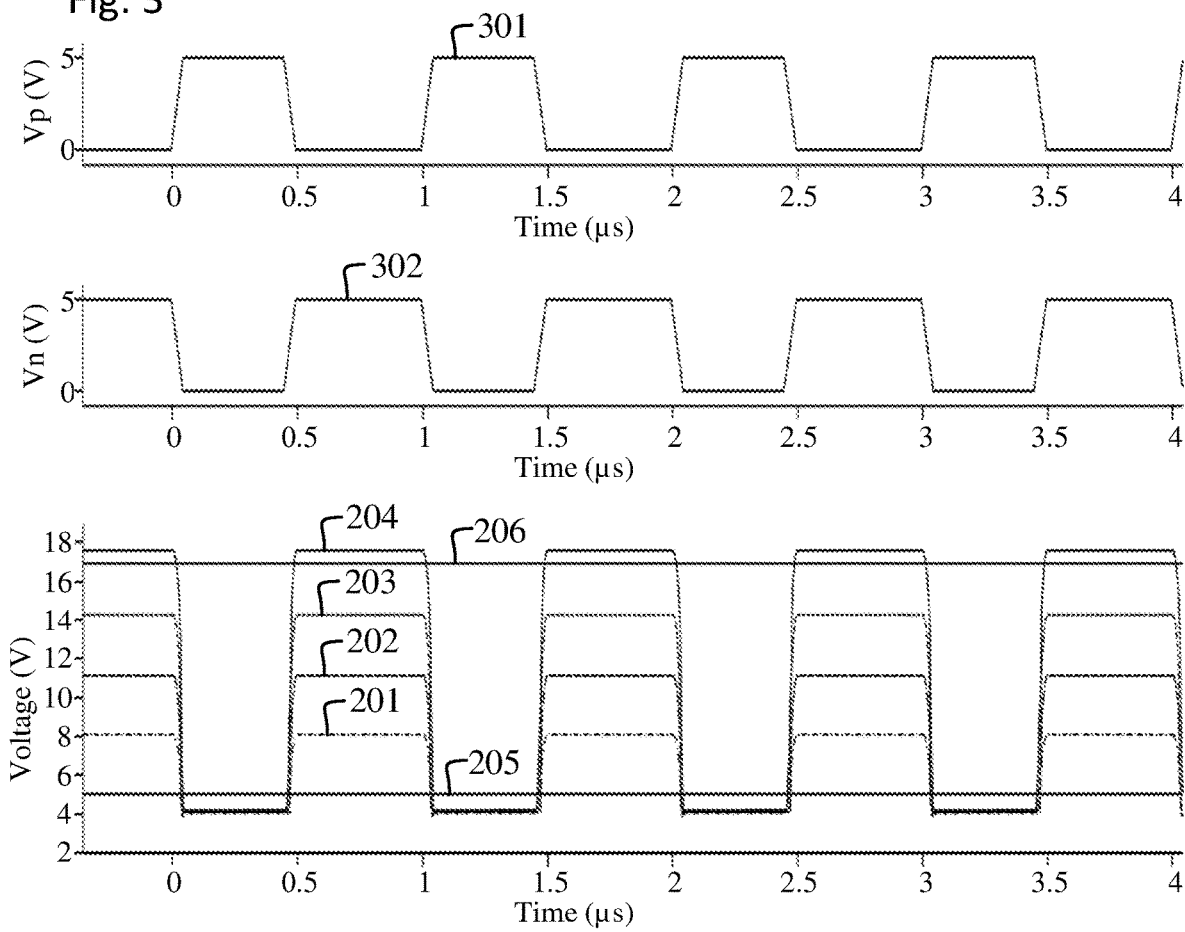

SERIES-PARALLEL CHARGE PUMP WITH NMOS DEVICES

RELATED APPLICATIONS

This application is a continuation of U.S. patent application Ser. No. 16/529,018, filed Aug. 1, 2019, which is hereby incorporated by reference for all purposes.

BACKGROUND

Series-parallel charge pumps generally charge a set of capacitors in a parallel configuration and then cascade them together in a series configuration to discharge them. The voltage level generated on each capacitor during charging is thus stacked in series during discharging to produce a higher resulting output voltage. NMOS and PMOS transistor switches (n-type and p-type metal-oxide-semiconductor field-effect transistor (MOSFET) devices) are typically included together in conventional charge pump circuits for switching the capacitors between the parallel and series configurations.

SUMMARY

In accordance with some embodiments, a method using a charge pump with only NMOS devices includes: charging a plurality of capacitors in to a parallel charged voltage level by electrically connecting the capacitors in parallel between an input voltage node and a ground by activating a plurality of first NMOS transistor switches and a plurality of second NMOS transistor switches and deactivating a plurality of third NMOS transistor switches; and generating a series capacitor output voltage level at a capacitor series output node by electrically connecting and discharging the capacitors in series between the input voltage node and the capacitor series output node by activating the third NMOS transistor switches and deactivating the first NMOS transistor switches and the second NMOS transistor switches.

In accordance with some embodiments, a charge pump using only NMOS devices includes a plurality of capacitors, a plurality of first NMOS transistor switches, a plurality of second NMOS transistor switches, and a plurality of third NMOS transistor switches. The first NMOS transistor switches and the second NMOS transistor switches are electrically connected to the capacitors to charge the capacitors in parallel between an input voltage node and a ground when the first NMOS transistor switches and the second NMOS transistor switches are activated. The capacitors are charged to a parallel charged voltage level. The third NMOS transistor switches are electrically connected to the capacitors to generate a series capacitor output voltage level at a capacitor series output node by discharging the capacitors in series between the input voltage node and the capacitor series output node when the third NMOS transistor switches are activated. The first NMOS transistor switches and the second NMOS transistor switches are activated when the third NMOS transistor switches are deactivated. The third NMOS transistor switches are activated when the first NMOS transistor switches and the second NMOS transistor switches are deactivated.

In accordance with some embodiments, an improved charge pump includes a plurality of capacitors, a plurality of first switches, a plurality of second switches, a plurality of third switches, and a plurality of resistors. Each of the capacitors has a high voltage node and a low voltage node. The first switches and the second switches are electrically connected to the capacitors to charge the capacitors in parallel between an input voltage node and a ground when the first switches and the second switches are activated. The capacitors are charged to a parallel charged voltage level. The third switches are electrically connected to the capacitors to generate a series capacitor output voltage level at a capacitor series output node by discharging the capacitors in series between the input voltage node and the capacitor series output node when the third switches are activated. Each of the resistors corresponds to one of the capacitors and to one of the third switches. Each of the resistors is electrically connected between the high voltage node of the corresponding one of the capacitors and a gate node of the corresponding one of the third switches. A current through each resistor causes a gate-source voltage of the corresponding one of the third switches that deactivates the corresponding one of the third switches when the first switches and the second switches are activated. Each resistor pulls a gate voltage of the corresponding one of the third switches to a voltage level of the high voltage node of the corresponding one of the capacitors to activate the corresponding one of the third switches when the first switches and the second switches are deactivated.

In some embodiments, the charge pump also includes a plurality of fourth NMOS transistor switches. Each of the fourth NMOS transistor switches corresponds to one of the resistors and to one of the third NMOS transistor switches. Each of the fourth NMOS transistor switches is electrically connected to the corresponding one of the resistors at the gate node of the corresponding one of the third NMOS transistor switches. Each of the fourth NMOS transistor switches is activated to cause the current through the corresponding one of the resistors when the first NMOS transistor switches and the second NMOS transistor switches are activated. The fourth NMOS transistor switches are deactivated when the first NMOS transistor switches and the second NMOS transistor switches are deactivated.

In some embodiments, the charge pump also includes a current source, a fifth NMOS transistor switch, and a sixth NMOS transistor switch. The fifth NMOS transistor switch is electrically connected to the current source. The sixth NMOS transistor switch is electrically connected to the current source and the fifth NMOS transistor switch. The fifth NMOS transistor switch is deactivated when the first NMOS transistor switches and the second NMOS transistor switches are activated, and the fifth NMOS transistor switch is activated when the first NMOS transistor switches and the second NMOS transistor switches are deactivated. Deactivation of the fifth NMOS transistor switch causes the current source and the sixth NMOS transistor switch to generate a gate drive voltage that activates the fourth NMOS transistor switches. Activation of the fifth NMOS transistor switch prevents generation of the gate drive voltage.

BRIEF DESCRIPTION OF THE DRAWINGS

FIG. 2 is a set of simplified timing diagrams illustrating operation of the charge pump shown in FIG. 1, in accordance with some embodiments.

FIG. 3 is another set of simplified timing diagrams illustrating operation of the charge pump shown in FIG. 1, in accordance with some embodiments.

DETAILED DESCRIPTION

Figure 1:
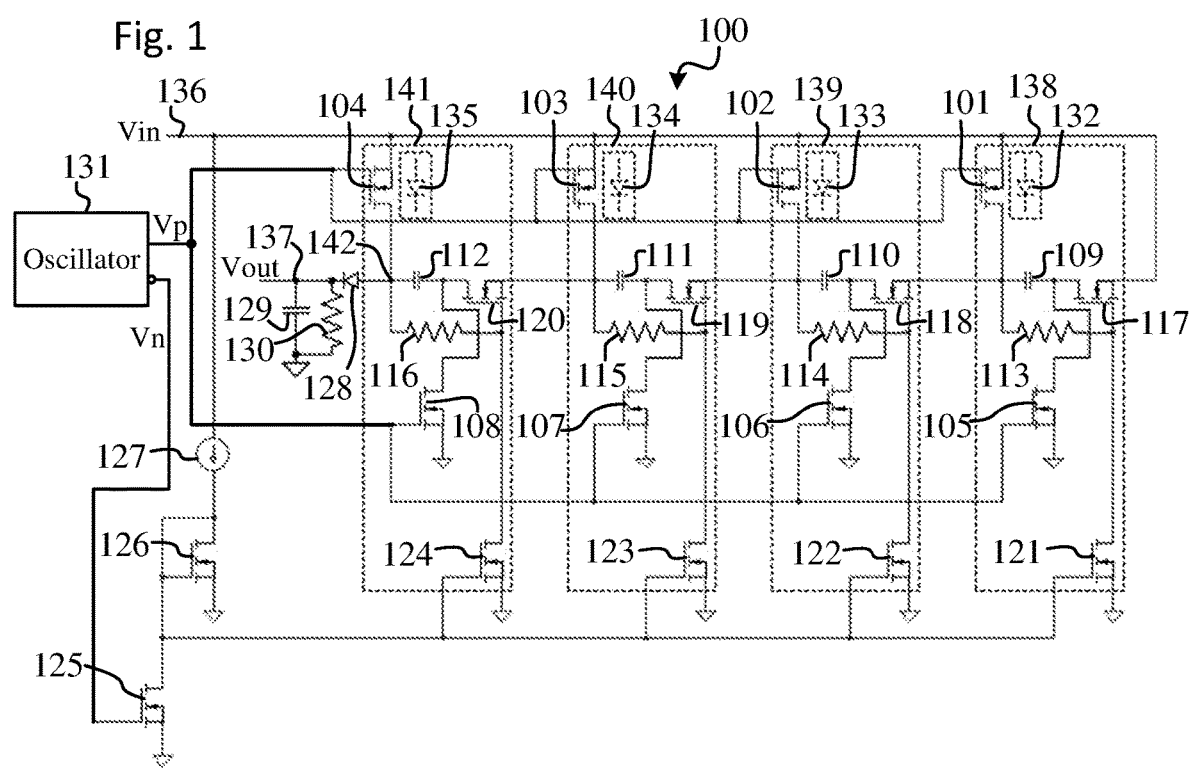
FIG. 1 is a simplified schematic diagram of a charge pump, in accordance with some embodiments.

An example circuit for an improved cascaded, series-parallel charge pump 100 is shown in FIG. 1, in accordance with some embodiments. The charge pump 100 generally includes a set of stages having several transistor switches or devices, all of which are N-type laterally diffused MOSFET (NMOS or N-type LDMOS) devices, such as the NMOS/LDMOS devices produced with the ZqFET™ technology from Silanna Semiconductor. NMOS devices typically have much less resistance and/or are much smaller than PMOS devices. The inclusion of the PMOS devices in conventional charge pumps, therefore, places certain design restrictions on the physical layout/size and operating parameters of the resulting circuit for the charge pump. On the other hand, the inclusion of only NMOS devices in the stages of the charge pump 100 ensures that all of the transistor switches have a relatively low resistance with a relatively small size for greater efficiency and smaller overall size for the charge pump 100. Additionally, the breakdown voltage levels of the NMOS and PMOS devices in conventional charge pumps typically lead to further design restrictions or considerations, e.g., with respect to the number of stages that must be used to produce the desired output voltage, the voltage that can be put across each stage, and/or the efficiency or reliability of each stage. For the improved charge pump 100, however, the NMOS devices produced with the ZqFET™ technology from Silanna Semiconductor provide a relatively high breakdown voltage that allows for a relatively large voltage across each stage of the charge pump 100, thereby relieving or relaxing the affected design restrictions or considerations. Furthermore, the inclusion of both NMOS and PMOS devices in the same integrated circuit places additional requirements on the process steps of the overall manufacturing process for producing conventional charge pumps, since components of both types of devices cannot necessarily be formed in the same steps. However, using generally the same or similar NMOS devices throughout the improved charge pump 100 enables the devices to be manufactured in generally the same process steps. The physical layout, performance characteristics, and manufacturing processes for the improved charge pump 100, therefore, enable the charge pump 100 to be usable in many more embodiments or applications than is typical for conventional charge pump circuits.

In some embodiments, the charge pump 100 generally includes first NMOS transistor switches 101-104, second NMOS transistor switches 105-108, capacitors 109-112, resistors 113-116, third NMOS transistor switches 117-120, fourth NMOS transistor switches 121-124, fifth and sixth NMOS transistor switches 125 and 126, a current source 127, an output diode 128, an output capacitor 129, an output resistor 130, and an oscillator 131, among other components not shown for simplicity. In some embodiments, the charge pump 100 includes input diodes 132-135 (shown in dashed lines) in place of the first NMOS transistor switches 101-104. The charge pump 100 generally receives an input voltage Vin at an input voltage node 136 and produces therefrom an output voltage Vout (a charge pump output voltage level) at an output voltage node 137.

The first NMOS transistor switches 101-104, the second NMOS transistor switches 105-108, the capacitors 109-112, the resistors 113-116, the third NMOS transistor switches 117-120, and the fourth NMOS transistor switches 121-124 are configured in corresponding stages 138-141, respectively. Each component in the stages 138-141 may be referred to as corresponding to the other components in the same stage. Additionally, each stage 138-140 (or the components therein) may be referred to as a previous stage (or component) with respect to the stages 139-141 (or the components therein), respectively; and each stage 139-141 (or the components therein) may be referred to as a subsequent stage (or component) with respect to the stages 138-140 (or the components therein), respectively.

Within each stage 138-141, the capacitor 109-112 is electrically connected in parallel between the input voltage Vin at the input voltage node 136 and a ground (or a reference point for a reference voltage level) through the corresponding first NMOS transistor switch 101-104 and second NMOS transistor switch 105-108 when the first NMOS transistor switches 101-104 and the second NMOS transistor switches 105-108 are turned on or activated, as described below. Additionally, the capacitors 109-112 are electrically connected in series through each stage 138-141 from the input voltage node 136 to a capacitor series output node 142 when the third NMOS transistor switches 117-120 are turned on or activated, as described below.

Four stages 138-141 are shown in the embodiment of FIG. 1. However, other embodiments may have any appropriate number of stages (from a first stage 138, through any number of intermediate stages 139 and 140, to a final stage 141), each with corresponding components 101-124 therein. The number of stages in a given application may depend on the desired voltage level of the output voltage Vout, the available voltage level of the input voltage Vin, and the voltage level amount that each stage contributes to form the output voltage Vout.

Each of the capacitors 109-112 has a high voltage side or node (left side of each capacitor 109-112 as illustrated) and a low voltage side or node (right side of each capacitor 109-112 as illustrated). Each of the NMOS transistor switches 101-108, 117-124, 125 and 126 generally has a gate node (or activation node), a source node, and a drain node. Each of the resistors 113-116 generally has a first node (left side of each resistor 113-116 as illustrated) and a second node (right side of each resistor 113-116 as illustrated).

For each stage 138-141: each of the first NMOS transistor switches 101-104 is electrically connected between the input voltage node 136 and the high voltage node of the corresponding one of the capacitors 109-112, each of the second NMOS transistor switches 105-108 is electrically connected between the ground and the low voltage node of the corresponding one of the capacitors 109-112, and the third NMOS transistor switches 117-120 are electrically connected in series with the capacitors 109-112. Additionally, the initial third NMOS transistor switch 117 is electrically connected between the input voltage node 136 and the low voltage node of the corresponding initial capacitor 109, each remaining third NMOS transistor switch 118-120 is electrically connected between the low voltage node of the corresponding remaining capacitor 110-112 and the high voltage node of the previous capacitor 109-111, respectively, in the series. Furthermore, the first NMOS transistor switches 101-104 and the second NMOS transistor switches 105-108 are activated to electrically connect the capacitors 109-112 in parallel between the input voltage node 136 and the ground; and the third NMOS transistor switches 117-120 are activated to electrically connect the capacitors 109-112 in series between the input voltage node 136 and the capacitor series output node 142.

Therefore, the source node of the corresponding first NMOS transistor switch 101-104 is electrically connected to the input voltage Vin at the input voltage node 136. The gate node of the corresponding first NMOS transistor switch 101-104 and the gate node of the corresponding second NMOS transistor switch 105-108 are electrically connected together to a first oscillating voltage signal Vp. The drain node of the corresponding first NMOS transistor switch 101-104, the high voltage node of the corresponding capacitor 109-112, and the first node of the corresponding resistor 113-116 are electrically connected together. The low voltage node of the corresponding capacitor 109-112 and the drain nodes of the corresponding second NMOS transistor switch 105-108 and the corresponding third NMOS transistor switch 117-120 are electrically connected together. The second node of the corresponding resistor 113-116, the gate node of the corresponding third NMOS transistor switch 117-120, and the drain node of the corresponding fourth NMOS transistor switch 121-124 are electrically connected together. The source nodes of the corresponding second NMOS transistor switch 105-108 and the corresponding fourth NMOS transistor switch 121-124 are electrically connected to the ground. The gate node of the corresponding fourth NMOS transistor switch 121-124 is electrically connected to the drain nodes of the fifth and sixth NMOS transistor switches 125 and 126, the gate node of the sixth NMOS transistor switch 126, and an output node of the current source 127.

Additionally, for the initial stage 138, the source node of the initial third NMOS transistor switch 117 is electrically connected to the input voltage Vin at the input voltage node 136; and the drain node of the initial first NMOS transistor switch 101, the high voltage node of the initial capacitor 109, and the first node of the initial resistor 113 are also electrically connected to the source node of the subsequent third NMOS transistor switch 118 in the subsequent stage 139. Also, for the intermediate stages 139-140, the drain node of the intermediate first NMOS transistor switch 102-103, the high voltage node of the intermediate capacitor 110-111, and the first node of the intermediate resistor 114-115 are also electrically connected to the source node of the subsequent third NMOS transistor switch 119-120 (of the intermediate and final stages 140-141). Furthermore, for the final stage 141, the drain node of the final first NMOS transistor switch 104, the high voltage node of the final capacitor 112, and the first node of the final resistor 116 are also electrically connected to an anode or input node of the output diode 128.

In embodiments using the input diodes 132-135, on the other hand, an anode or input node of the input diodes 132-135 is electrically connected in place of the source node of the corresponding first NMOS transistor switch 101-104, a cathode or output node of the input diodes 132-135 is electrically connected in place of the drain node of the corresponding first NMOS transistor switch 101-104, and the first oscillating voltage signal Vp is electrically connected only to the gate node of the corresponding second NMOS transistor switch 105-108.

Additionally, an input node of the current source 127 is electrically connected to the input voltage Vin at the input voltage node 136. The source nodes of the fifth and sixth NMOS transistor switches 125 and 126 are electrically connected to the ground. The gate node of the fifth NMOS transistor switch 125 is electrically connected to a second oscillating voltage signal Vn.

A cathode or output node of the output diode 128 is electrically connected to the output voltage node 137, a high voltage node of the output capacitor 129, and a first node of the output resistor 130. Additionally, a low voltage node of the output capacitor 129 and a second node of the output resistor 130 are electrically connected to the ground, so that the output capacitor 129 and the output resistor 130 are electrically connected in parallel between the output voltage node 137 and the ground.

The oscillator 131 generally has a first (non-inverted) output at which it produces the first (or non-inverted or positive) oscillating voltage signal Vp and a second (inverted) output at which it produces the second (or inverted or negative) oscillating voltage signal Vn. The first oscillator output is electrically connected to the gate nodes of the first and second NMOS transistor switches 101-108, and the second oscillator output is electrically connected to the gate node of the fifth NMOS transistor switch 125. For embodiments that include the input diodes 132-135, the first oscillator output is electrically connected only to the gate nodes of the second NMOS transistor switches 105-108.

In operation, the oscillator 131 produces the first and second oscillating voltage signals Vp and Vn as inverted voltage signals of each other. Thus, the first and second oscillating voltage signals Vp and Vn have the same frequency, but opposite duty cycles. A first portion of each cycle or period of the first and second oscillating voltage signals Vp and Vn corresponds to a parallel charging time period, and a second portion of each cycle or period of the first and second oscillating voltage signals Vp and Vn corresponds to a series discharging time period.

During the parallel charging time period, the first and second NMOS transistor switches 101-108 are turned on or activated by a high voltage level of the first oscillating voltage signal Vp to electrically connect each of the capacitors 109-112 in parallel between the input voltage Vin at the input voltage node 136 (via the first NMOS transistor switches 101-104) and the ground (via the second NMOS transistor switches 105-108). Thus, an electrical connection is established from the input voltage Vin at the input voltage node 136 through each of the capacitors 109-112 in parallel to the ground, so that each of the capacitors 109-112 can be charged up to a parallel charged voltage level that depends on the voltage level of the input voltage Vin and any voltage drop across each pair of the first and second NMOS transistor switches 101-108.

Also, during the parallel charging time period, the fifth NMOS transistor switch 125 is turned off or deactivated by a low voltage level of the second oscillating voltage signal Vn. Deactivation of the fifth NMOS transistor switch 125 causes the configuration of the current source 127 and the sixth NMOS transistor switch 126 to generate a gate drive bias voltage on the gate nodes of the fourth NMOS transistor switches 121-124 that turns on or activates the fourth NMOS transistor switches 121-124. Activation of the fourth NMOS transistor switches 121-124 causes each of the fourth NMOS transistor switches 121-124 to serve as a current source to pull a current through the corresponding resistor 113-116 and the activated corresponding first NMOS transistor switch 101-104. The resistances of the resistors 113-116 are selected such that the current pulled or flowed therethrough causes a voltage drop across the resistors 113-116 that results (due to the voltage level of the input voltage Vin and to the configuration of the capacitors 109-112, the resistors 113-116, and the third NMOS transistor switches 117-120) in generating a gate-source voltage of the corresponding third NMOS transistor switches 117-120 that turns off or deactivates the third NMOS transistor switches 117-120. In some embodiments, for example, about 3 V across the resistors 113-116 maintains the third NMOS transistor switches 117-120 turned off or deactivated. In this manner, the deactivated third NMOS transistor switches 117-120 do not affect or interfere with the parallel charging of the capacitors 109-112 when the first NMOS transistor switches 101-104 and the second NMOS transistor switches 105-108 are activated during the parallel charging time period.

During the series discharging time period, on the other hand, the fifth NMOS transistor switch 125 is turned on or activated by a high voltage level of the second oscillating voltage signal Vn. Activation of the fifth NMOS transistor switch 125 causes the gate node of the sixth NMOS transistor switch 126 as well as the gates nodes of the fourth NMOS transistor switches 121-124 to be pulled to the ground, so that the fourth NMOS transistor switches 121-124 are turned off or deactivated. Deactivation of the fourth NMOS transistor switches 121-124 removes the current that was being pulled through the resistors 113-116 during the parallel charging time period. Without the current through the resistors 113-116 there is no voltage drop across the resistors 113-116, so the second nodes of the resistors 113-116 and the gate nodes of the third NMOS transistor switches 117-120 are pulled up to the voltage level of the first nodes of the resistors 113-116, or the high voltage nodes of the capacitors 109-112. In this situation, the voltage level on the gate nodes of the third NMOS transistor switches 117-120 causes the third NMOS transistor switches 117-120 to turn on or be activated. In this manner, the third NMOS transistor switches 117-120 are turned on or activated to electrically connect, cascade or stack the capacitors 109-112 in series between the input voltage Vin at the input voltage node 136 and the capacitor series output node 142, which is (or is connected to) the high voltage node of the final capacitor 112. Thus, an electrical connection is established from the input voltage Vin at the input voltage node 136 through each of the capacitors 109-112 in series to the output voltage node 137, so that the capacitors 109-112 can be discharged in series, such that the voltage across each capacitor 109-112 is stacked or added in series with each other and with the input voltage Vin to produce a series capacitor output voltage level at the capacitor series output node 142.

Also, during the series discharging time period, the first NMOS transistor switches 101-104 and the second NMOS transistor switches 105-108 are turned off or deactivated by a low voltage level of the first oscillating voltage signal Vp. In this manner, the first NMOS transistor switches 101-104 and the second NMOS transistor switches 105-108 do not affect or interfere with the series discharging of the capacitors 109-112 during the series discharging time period.

The series capacitor output voltage level at the capacitor series output node 142, charges the output capacitor 129 in an RC circuit formed by the parallel configuration of the output capacitor 129 and the output resistor 130. The output diode 128 is forward biased to allow current to flow from the capacitor series output node 142 to the output voltage node 137 during the series discharging time period when the series capacitor output voltage level is produced from the stacked voltages of the capacitors 109-112 in series with the input voltage Vin. The output capacitor 129 is thereby charged to an overall charge pump output voltage level at the output voltage node 137. Additionally, the output diode 128 is reversed biased to prevent current flow (and unnecessary discharge of the output capacitor 129) to the capacitor series output node 142 from the output voltage node 137 during the parallel charging time period, i.e., when the parallel charged voltage level (which is lower than the overall charge pump output voltage level) is generated on the capacitors 109-112 in parallel between the input voltage Vin and the ground.

In an ideal situation, i.e., no losses or inefficiencies, the parallel charged voltage level to which each capacitor 109-112 is charged during the parallel charging time period would be the same as the input voltage Vin. Thus, during the series discharging time period, with the input voltage Vin applied at the low voltage node of the initial capacitor 109, the stacked voltage level at the high voltage node of the initial capacitor 109 would be 2×Vin, the stacked voltage level at the high voltage node of the intermediate capacitor 110 would be 3×Vin, the stacked voltage level at the high voltage node of the next intermediate capacitor 111 would be 4×Vin, and the stacked voltage level at the high voltage node of the final capacitor 112 (i.e., the series capacitor output voltage level and, thus, the overall charge pump output voltage level) would be 5×Vin. However, under realistic conditions, some losses or inefficiencies occur in the components, so that the parallel charged voltage level is somewhat less than the input voltage Vin, and the voltage levels at the high voltage nodes of the capacitors 109-112 are not simply multiples of the input voltage Vin. The overall charge pump output voltage level at the output voltage node 137 is, thus, somewhat less than an exact multiple of the input voltage Vin. Nevertheless, the relatively high breakdown voltage of the NMOS devices produced with the ZqFET™ technology from Silanna Semiconductor enable a relatively large voltage across each of the stages 138-141 or the capacitors 109-112. For example, in some embodiments, the breakdown voltage can be in a range between about 3 V, 12 V, 40 V, or 50 V, so that between about 3V, 12 V, 40 V, or 50 V could potentially be stacked by each of the stages 138-141 or capacitors 109-112 to generate a relatively large overall charge pump output voltage level at the output voltage node 137.

In some embodiments, operation of the charge pump 100 is illustrated by timing diagrams 201-204 shown in FIG. 2. The timing diagrams 201-204 were generated by a simulation of an example of the charge pump 100 in which the input voltage Vin was about 5 V, a clock period for the first and second oscillating voltage signals Vp and Vn was about 1 µs (frequency of 1 MHz), a clock duty cycle for the first and second oscillating voltage signals Vp and Vn was about 50%, and the NMOS transistor switches 101-108, 117-124, 125 and 126 were modeled with the ZqFET™ technology from Silanna Semiconductor.

The timing diagrams 201-204 show the voltage levels at the high voltage nodes of the capacitors 109-112, respectively, for several cycles or periods of operation from a startup condition to approaching a steady state condition. Additionally, the input voltage Vin is shown by graph 205 (steady at about 5 V), and the resulting overall charge pump output voltage level for the output voltage Vout is shown by graph 206.

The timing diagrams 201-204 exhibit about the same low voltage level (about 4 V or slightly higher) during a first portion of each cycle. This low voltage level generally represents the parallel charged voltage level to which each capacitor 109-112 is charged during the parallel charging time period.

Additionally, the timing diagrams 201-204 exhibit different high voltage levels during a second portion of each cycle. These high voltage levels generally represent the stacked voltage levels at the high voltage nodes of the capacitors 109-112 during the series discharging time period. Therefore, the high voltage level of the timing diagram 201 represents the stacked voltage level at the high voltage node of the capacitor 109 due to stacking the voltage level across the capacitor 109 onto the input voltage Vin at the input voltage node 136; the high voltage level of the timing diagram 202 represents the stacked voltage level at the high voltage node of the capacitor 110 due to stacking the voltage level across the capacitor 110 onto the stacked voltage level at the high voltage node of the capacitor 109;

the high voltage level of the timing diagram 203 represents the stacked voltage level at the high voltage node of the capacitor 111 due to stacking the voltage level across the capacitor 111 onto the stacked voltage level at the high voltage node of the capacitor 110; and the high voltage level of the timing diagram 204 represents the stacked voltage level at the high voltage node of the capacitor 112 due to stacking the voltage level across the capacitor 112 onto the stacked voltage level at the high voltage node of the capacitor 111. The high voltage level of the timing diagram 204, thus, also represents the series capacitor output voltage level at the capacitor series output node 142.

The high voltage levels of the timing diagrams 201-204 exhibit a relatively steady state condition after initially rising during each cycle following the startup due to the time required to fully charge the capacitors 109-112. Additionally, the resulting overall charge pump output voltage level (graph 206) also exhibits a relatively steady state condition after initially rising along with the high voltage levels of the timing diagrams 201-204 following the startup due to the charging of the output capacitor 129 at the output voltage node 137 by the series capacitor output voltage level at the capacitor series output node 142.

Due to losses or inefficiencies in the components, the overall charge pump output voltage level (graph 206) remains below the high voltage level of the series capacitor output voltage level (timing diagram 204). Also, the low voltage level of each timing diagram 201-204 is about 4 V (or slightly higher), rather than the 5 V of the input voltage Vin (graph 205). Additionally, the voltage level amount that each stage 138-141 contributes to form the overall charge pump output voltage level for the output voltage Vout is about 3.1-3.5 V, rather than the 5 V of the input voltage Vin (graph 205). Therefore, in this example, the steady state stacked voltage level at the high voltage node of the initial capacitor 109 (timing diagram 201) is about 8.1 V, the steady state stacked voltage level at the high voltage node of the intermediate capacitor 110 (timing diagram 202) is about 11.2 V, the steady state stacked voltage level at the high voltage node of the next intermediate capacitor 111 (timing diagram 203) is about 14.4 V, the steady state stacked voltage level at the high voltage node of the final capacitor 112 (timing diagram 204) is about 17.9 V, and the overall charge pump output voltage level (graph 206) is about 17.2 V; thereby demonstrating the advantageous operation of the improved cascaded, series-parallel charge pump 100.

In some embodiments, operation of the charge pump 100 is further illustrated by timing diagrams 301-302 shown in FIG. 3 after timing diagrams 201-204 achieve steady state conditions. The timing diagrams 301-302 show the first and second oscillating voltage signals Vp and Vn, respectively, with about a 50% duty cycle. When the voltage level of the first oscillating voltage signal Vp is high and the voltage level of the second oscillating voltage signal Vn is low, the timing diagrams 201-204 are at about the same low voltage level (about 4 V or slightly higher), i.e., the parallel charging time period. When the voltage level of the first oscillating voltage signal Vp is low and the voltage level of the second oscillating voltage signal Vn is high, the timing diagrams 201-204 are at about their steady state stacked voltage level, i.e., the series discharging time period. Additionally, the overall charge pump output voltage level (graph 206) is relatively steady.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
charging a plurality of capacitors in a charge pump to a parallel charged voltage level by electrically connecting the plurality of capacitors in parallel between an input voltage node and a ground by activating a plurality of parallel charging switches and deactivating a plurality of series discharging switches;
generating a series capacitor output voltage level at a capacitor series output node by electrically connecting and discharging the plurality of capacitors in series between the input voltage node and the capacitor series output node by activating the plurality of series discharging switches and deactivating the plurality of parallel charging switches; and
generating a gate-source voltage for each of the plurality of series discharging switches by flowing a current through a plurality of resistors, each resistor of the plurality of resistors corresponding to one of the plurality of capacitors and to one of the plurality of series discharging switches.

2. The method of claim 1, wherein:
each of the plurality of capacitors has a high voltage node and a low voltage node;
the plurality of parallel charging switches includes a plurality of first parallel charging switches and a plurality of second parallel charging switches;
each of the plurality of first parallel charging switches corresponds to one of the plurality of capacitors;
each of the plurality of first parallel charging switches is electrically connected between the input voltage node and the high voltage node of the corresponding one of the plurality of capacitors;
each of the plurality of second parallel charging switches corresponds to one of the plurality of capacitors;
each of the plurality of second parallel charging switches is electrically connected between the ground and the low voltage node of the corresponding one of the plurality of capacitors;
the plurality of series discharging switches is electrically connected in series with the plurality of capacitors;
an initial series discharging switch of the plurality of series discharging switches is electrically connected between the input voltage node and the low voltage node of a corresponding initial capacitor of the plurality of capacitors;
each remaining series discharging switch of the plurality of series discharging switches is electrically connected between the low voltage node of a corresponding remaining one of the plurality of capacitors and the high voltage node of a previous one of the plurality of capacitors in the series; and the high voltage node of a final one of the plurality of capacitors in the series is electrically connected to the capacitor series output node.

3. The method of claim 1, wherein:

the plurality of parallel charging switches and the plurality of series discharging switches have a breakdown voltage of about 3-50 volts to charge the plurality of capacitors to the parallel charged voltage level.

4. The method of claim 1, wherein each of the plurality of capacitors has a high voltage node and a low voltage node;

each resistor of the plurality of resistors is electrically connected between the high voltage node of the corresponding one of the plurality of capacitors and a gate node of the corresponding one of the plurality of series discharging switches;

the gate-source voltage generated by each resistor of the plurality of resistors deactivates the corresponding one of the plurality of series discharging switches when the plurality of parallel charging switches are activated; and each resistor of the plurality of resistors pulls a gate voltage of the corresponding one of the plurality of series discharging switches to a voltage level of the high voltage node of the corresponding one of the plurality of capacitors to activate the corresponding one of the plurality of series discharging switches when the plurality of parallel charging switches are deactivated.

5. The method of claim 1, further comprising:

generating the current through each of the plurality of resistors by activating a corresponding one of a plurality of current source switches when the plurality of parallel charging switches are activated;

wherein:

each of the plurality of current source switches corresponds to one of the plurality of resistors and to one of the plurality of series discharging switches;

each of the plurality of current source switches is electrically connected to the corresponding one of the plurality of resistors at a gate node of the corresponding one of the plurality of series discharging switches; and the plurality of current source switches are deactivated when the plurality of parallel charging switches are deactivated.

6. The method of claim 5, further comprising:

activating the plurality of current source switches by generating a gate drive voltage for the plurality of current source switches upon deactivating a grounding switch when the plurality of parallel charging switches are activated;

wherein:

deactivation of the grounding switch causes a current source and a bias voltage switch to generate the gate drive voltage;

the grounding switch is activated when the plurality of parallel charging switches are deactivated; and activation of the grounding switch prevents the generating of the gate drive voltage.

7. The method of claim 1, further comprising:

generating, by an output diode, an output capacitor and an output resistor, a charge pump output voltage level from the series capacitor output voltage level;

the output diode has an anode electrically connected to the capacitor series output node and a cathode electrically connected to an output voltage node of the charge pump;

the output capacitor is electrically connected between the output voltage node and the ground; and the output resistor is electrically connected in parallel with the output capacitor.

8. A charge pump comprising:

a plurality of capacitors;

a plurality of parallel charging switches electrically connected to the plurality of capacitors to charge the plurality of capacitors in parallel between an input voltage node and a ground when the plurality of parallel charging switches are activated, the plurality of capacitors being charged to a parallel charged voltage level;

a plurality of series discharging switches electrically connected to the plurality of capacitors to generate a series capacitor output voltage level at a capacitor series output node by discharging the plurality of capacitors in series between the input voltage node and the capacitor series output node when the plurality of series discharging switches are activated; and a plurality of resistors, each corresponding to one of the plurality of capacitors and to one of the plurality of series discharging switches;

and wherein:

the plurality of parallel charging switches are activated when the plurality of series discharging switches are deactivated; and the plurality of series discharging switches are activated when the plurality of parallel charging switches are deactivated.

9. The charge pump of claim 8, wherein:

each of the plurality of capacitors has a high voltage node and a low voltage node;

the plurality of parallel charging switches includes a plurality of first parallel charging switches and a plurality of second parallel charging switches;

each of the plurality of first parallel charging switches corresponds to one of the plurality of capacitors;

each of the plurality of first parallel charging switches is electrically connected between the input voltage node and the high voltage node of the corresponding one of the plurality of capacitors;

each of the plurality of second parallel charging switches corresponds to one of the plurality of capacitors;

each of the plurality of second parallel charging switches is electrically connected between the ground and the low voltage node of the corresponding one of the plurality of capacitors;

the plurality of series discharging switches is electrically connected in series with the plurality of capacitors;

an initial series discharging switch of the plurality of series discharging switches is electrically connected between the input voltage node and the low voltage node of a corresponding initial capacitor of the plurality of capacitors;

each remaining series discharging switch of the plurality of series discharging switches is electrically connected between the low voltage node of a corresponding remaining one of the plurality of capacitors and the high voltage node of a previous one of the plurality of capacitors in the series;

the high voltage node of a final one of the plurality of capacitors in the series is electrically connected to the capacitor series output node.

10. The charge pump of claim 8, wherein:
the plurality of parallel charging switches and the plurality of series discharging switches have a breakdown voltage of about 3-50 volts to charge the plurality of capacitors to the parallel charged voltage level.

11. The charge pump of claim 8, wherein:
each of the plurality of capacitors has a high voltage node and a low voltage node;
each resistor of the plurality of resistors is electrically connected between the high voltage node of the corresponding one of the plurality of capacitors and a gate node of the corresponding one of the plurality of series discharging switches;
a current through each resistor of the plurality of resistors causes a gate-source voltage of the corresponding one of the plurality of series discharging switches that deactivates the corresponding one of the plurality of series discharging switches when the plurality of parallel charging switches are activated; and
each resistor of the plurality of resistors pulls a gate voltage of the corresponding one of the plurality of series discharging switches to a voltage level of the high voltage node of the corresponding one of the plurality of capacitors to activate the corresponding one of the plurality of series discharging switches when the plurality of parallel charging switches are deactivated.

12. The charge pump of claim 8, further comprising:
a plurality of current source switches, each corresponding to one of the plurality of resistors and to one of the plurality of series discharging switches, each of the plurality of current source switches being electrically connected to the corresponding one of the plurality of resistors at a gate node of the corresponding one of the plurality of series discharging switches, each of the plurality of current source switches being activated to cause the current through the corresponding one of the plurality of resistors when the plurality of parallel charging switches are activated, and the plurality of current source switches being deactivated when the plurality of parallel charging switches are deactivated.

13. The charge pump of claim 12, further comprising:
a current source;
a grounding switch electrically connected to the current source; and
a bias voltage switch electrically connected to the current source and the grounding switch;
and wherein:
the grounding switch is deactivated when the plurality of parallel charging switches are activated, and the grounding switch is activated when the plurality of parallel charging switches are deactivated;
deactivation of the grounding switch causes the current source and the bias voltage switch to generate a gate drive voltage that activates the plurality of current source switches; and
activation of the grounding switch prevents generation of the gate drive voltage.

14. The charge pump of claim 8, further comprising:
an output diode having an anode and a cathode, the anode being electrically connected to the capacitor series output node, and the cathode being electrically connected to an output voltage node of the charge pump;
an output capacitor electrically connected between the output voltage node and the ground; and
an output resistor electrically connected in parallel with the output capacitor;
and wherein the output diode, the output capacitor, and the output resistor generate a charge pump output voltage level from the series capacitor output voltage level.

15. A charge pump comprising:
a plurality of capacitors, each having a high voltage node and a low voltage node;
a plurality of input diodes and a plurality of charging switches electrically connected to the plurality of capacitors to charge the plurality of capacitors in parallel between an input voltage node and a ground when the plurality of charging switches are activated, the plurality of capacitors being charged to a parallel charged voltage level;
a plurality of discharging switches electrically connected to the plurality of capacitors to generate a series capacitor output voltage level at a capacitor series output node by discharging the plurality of capacitors in series between the input voltage node and the capacitor series output node when the plurality of discharging switches are activated; and
a plurality of resistors, each corresponding to one of the plurality of capacitors and to one of the plurality of discharging switches, each of the plurality of resistors being electrically connected between the high voltage node of the corresponding one of the plurality of capacitors and a gate node of the corresponding one of the plurality of discharging switches;
and wherein:
a current through each resistor of the plurality of resistors causes a gate-source voltage of the corresponding one of the plurality of discharging switches that deactivates the corresponding one of the plurality of discharging switches when the plurality of charging switches are activated; and
each resistor of the plurality of resistors pulls a gate voltage of the corresponding one of the plurality of discharging switches to a voltage level of the high voltage node of the corresponding one of the plurality of capacitors to activate the corresponding one of the plurality of discharging switches when the plurality of charging switches are deactivated.

16. The charge pump of claim 15, further comprising:
a plurality of current source switches, each corresponding to one of the plurality of resistors and to one of the plurality of discharging switches, each of the plurality of current source switches being electrically connected to the corresponding one of the plurality of resistors at the gate node of the corresponding one of the plurality of discharging switches, each of the plurality of current source switches being activated to cause the current through the corresponding one of the plurality of resistors when the plurality of charging switches are activated, and the plurality of current source switches being deactivated when the plurality of charging switches are deactivated.

17. The charge pump of claim 16, further comprising:
a current source;
a grounding switch electrically connected to the current source;
a bias voltage switch electrically connected to the current source and the grounding switch;
and wherein:

the grounding switch is deactivated when the plurality of charging switches are activated, and the grounding switch is activated when the plurality of charging switches are deactivated;

deactivation of the grounding switch causes the current source and the bias voltage switch to generate a gate drive voltage that activates the plurality of current source switches; and activation of the grounding switch prevents generation of the gate drive voltage.

18. The charge pump of claim 15, further comprising:

an output diode having an anode and a cathode, the anode being electrically connected to the capacitor series output node, and the cathode being electrically connected to an output voltage node of the charge pump;

an output capacitor electrically connected between the output voltage node and the ground; and an output resistor electrically connected in parallel with the output capacitor;

and wherein the output diode, the output capacitor, and the output resistor generate a charge pump output voltage level from the series capacitor output voltage level.

19. The charge pump of claim 15, wherein:

each of the plurality of input diodes corresponds to one of the plurality of capacitors;

each of the plurality of input diodes is electrically connected between the input voltage node and the high voltage node of the corresponding one of the plurality of capacitors;

each of the plurality of charging switches corresponds to one of the plurality of capacitors;

each of the plurality of charging switches is electrically connected between the ground and the low voltage node of the corresponding one of the plurality of capacitors;

the plurality of discharging switches is electrically connected in series with the plurality of capacitors;

an initial discharging switch of the plurality of discharging switches is electrically connected between the input voltage node and the low voltage node of a corresponding initial capacitor of the plurality of capacitors;

each remaining discharging switch of the plurality of discharging switches is electrically connected between the low voltage node of a corresponding remaining one of the plurality of capacitors and the high voltage node of a previous one of the plurality of capacitors in the series;

the high voltage node of a final one of the plurality of capacitors in the series is electrically connected to the capacitor series output node.

20. The charge pump of claim 15, wherein:

the plurality of charging switches and the plurality of discharging switches have a breakdown voltage of about 3-50 volts to charge the plurality of capacitors to the parallel charged voltage level.

* * * * *